United States Patent [19]
Marshall, III et al.

[11] 3,984,690
[45] Oct. 5, 1976

[54] CIRCUITRY FOR USE WITH AN IONIZING-RADIATION DETECTOR

[75] Inventors: J. Howard Marshall, III, Pasadena; Timothy M. Harrington, Sierra Madre, both of Calif.

[73] Assignee: MDH Industries, Inc., Monrovia, Calif.

[22] Filed: Apr. 2, 1975

[21] Appl. No.: 564,380

[52] U.S. Cl. .............................. 250/374; 250/336; 250/375
[51] Int. Cl.² ........................................ G01T 1/18
[58] Field of Search .................... 250/336, 374, 375

[56] References Cited
UNITED STATES PATENTS

| | | | |
|---|---|---|---|
| 3,683,189 | 8/1972 | Garrett | 250/374 X |
| 3,787,668 | 1/1974 | Currie et al. | 250/336 X |
| 3,875,410 | 4/1975 | Luger | 250/374 |

*Primary Examiner*—Archie R. Borchelt
*Attorney, Agent, or Firm*—Arthur V. Doble

[57] ABSTRACT

An improved system of circuitry for use in combination with an ionizing-radiation detector over a wide range of radiation levels includes a current-to-frequency converter together with a digital data processor for respectively producing and measuring a pulse repetition frequency which is proportional to the output current of the ionizing-radiation detector, a dc-to-dc converter for providing closely regulated operating voltages from a rechargeable battery and a bias supply for providing high voltage to the ionization chamber. The ionizing-radiation detector operating as a part of this system produces a signal responsive to the level of ionizing radiation in the vicinity of the detector, and this signal is converted into a pulse frequency which will vary in direct proportion to such level of ionizing-radiation. The data processor, by counting the number of pulses from the converter over a selected integration interval, provides a digital indication of radiation dose rate, and by accumulating the total of all such pulses provides a digital indication of total integrated dose. Ordinary frequency-to-voltage conversion devices or digital display techniques can be used as a means for providing audible and visible indications of dose and dose-rate levels.

12 Claims, 3 Drawing Figures

CIRCUITRY FOR USE WITH AN IONIZING-RADIATION DETECTOR

BACKGROUND OF THE INVENTION

1. Field of the Invention

This invention relates to apparatus for radiation detection and measurement to determine both dose rate and total integrated dose during exposure to ionizing radiation.

2. Description of the Prior Art

Various forms of radiation-detection dosimetry equipment have found extensive use in civilian as well as military applications. One of the most common civilian uses of such devices may be found in and around nuclear power plant installations and nuclear test sites for general radiation dosimetry purposes. Knowledge of radiation contamination may be extremely important to the health or even survival of equipment operators and other personnel in the immediate areas of the plants and also to the civilian population in broad areas surrounding the plant. The problems may range from low-level leakage necessitating repairs to high-level emergency situations requiring major correction. Depending on winds and other environmental conditions, any radiation leakage may be effectively mapped through the use of a series of strategically located, efficient and reliable dosimeters. The information obtained can be useful in implementing emergency safety action or even for establishing possible population escape routes.

Other civilian uses could include civil-defense monitoring, hospital and clinical radiation surveys, aircraft crew and cargo monitoring and the determination of radiation levels in other research or industrial areas which utilize radioactive materials.

The United States military forces also use radiation detection equipment covering the spectra from tactical usage such as estimation of residual troop potential after exposure, fallout mapping for tactical planning and estimation of contamination levels of personnel and provisions, to non-combat uses in the field and laboratory for personnel monitoring and protection.

Thus, a need exists for a small, portable radiation dosimeter, which must also be general purpose and easily used in order to be applicable to many radiation-monitoring situations. If the dosimeter is sufficiently general purpose, then the production volume could be sufficiently large to permit substantial cost reductions, adding even more to its applicability. Ease of use entails digital readout and freedom from complicated operator controls and adjustments.

Radiation dosimeters existing in the prior art exhibit some of these characteristics but not all of them in combination. For example, most previous dosimeters used an analog readout, such as a meter, and as a result usually had either a limited dynamic range or the need for an operator-controlled range switch. Such devices are more difficult to use than instruments with automatically-ranging digital readouts because of the need for operator interpretation of the meter reading and inherent inaccuracies in that process. Furthermore, the range switch may have to be correctly set, and the improper recording of its setting becomes a source of substantial measurement errors.

Many prior-art dosimeters were not sufficiently general purpose to provide both dose rate and total integrated-dose measurements. For example, an ionization chamber with a simple electrometer amplifier generally is a purely dose-rate instrument. On the otherhand, an electroscope-type dosimeter usually measures only total integrated dose. This pencil-size instrument is portable but also tends to be fragile and of limited dynamic range. None of these prior-art devices were truly automatic, often requiring manual zero and gain adjustments as well as range switching.

In addition, their portability was often severely limited by their power requirements. Many devices could only operate from line power or from large, heavy batteries. Because of their relatively large power drain, most devices which were battery powered could only operate for highly limited periods from the battery before recharging or replacement. In such cases portability meant only that the instrument could be physically carried. However, the general-purpose instrument should be shirt-pocket size and still capable of operating from its batteries for at least a day.

The recent advances in electronics, visual display techniques and packaging now permit the development of a portable, rugged and reliable radiation detection instrument which is capable of combining a plurality of functions into one conveniently-sized instrument. One such advance arose out of an analog-to-digital converter recently developed by applicants' employer, MDH Industries, Inc., Pasadena, Calif. This converter forms a part of an instrument for testing X-ray sources. That instrument contains an unsealed, air-equivalent, 6-cm$^3$ ionization chamber and associated low-power electronics with digital readout to measure radiation exposure rates over a $6 \times 10^6$ range from 1 mR/min to 100 R/s.

One of the main features included in that instrument is an improved Wide-Range Current-to-Frequency Converter, which is fully described in an application for U.S. Pat. Ser. No. 552,744 filed on Nov. 11, 1974, the inventor therein being J. Howard Marshall III, who is also one of the inventors herein. That invention is an improved wide range current-to-frequency converter for analog-to-digital conversion of low-level signals in a simple, low-power, self-zeroing circuit utilizing capacitive feedback. That circuit virtually eliminates the effects of voltage offsets at the input of the converter while avoiding large leakage currents, without the need for complicated and bulky range-changing switches, external zeroing using either automatic or manual techniques, or preceding electrometer amplifiers. The converter also includes a low-leakage charge-sensitive amplifier, a gated multivibrator, a charge pulser and a capacitive divider. The gated multivibrator under the control of the charge-sensitive amplifier at the input of the converter produces discrete pulses, which in turn cause the charge pulser to generate discrete units of charge, which are reduced in magnitude by the capacitive divider to become the charge-feedback pulses applied to the input of the charge-sensitive amplifier. This amplifier compares the feedback current consisting of repetitive charge-feedback pulses with the input current to the converter, and controls the gated multivibrator so that the pulse repetition rate varies in an appropriate manner to keep the feedback current equal to the instantaneous value of the input current, resulting in the repetition frequency of the gated-multivibrator pulses becoming a digital representation of the analog input current. This technique can provide a dynamic range of $10^7:1$ and can handle input currents as small as $10^{-14}$ A directly without preceding electrometer amplifiers. It also includes a mechanism for discharging the capacitive divider in a manner such that the circuit automatically establishes its own zero level.

SUMMARY OF THE INVENTION

Applicants herein have conceived of improved circuitry including the above-described digitizing electronics and a new digital data processor. This improved circuitry is an application of a variable-period reset to a capacitive-feedback current-to-frequency converter in combination with an ionizing-radiation detector and can be used to produce a truly general-purpose, digital readout, wide dynamic range, totally automatic, portable, shirt-pocket size, low-cost, rugged and reliable radiation-measuring apparatus. For one such embodiment of the circuitry invention, an ion chamber is used that is tissue equivalent for gammas from 80 keV to 3 MeV, and is linear up to 1000 rad/h. It requires a bias voltage of several hundred volts to accurately collect the ion-chamber current at dose rates up to 1000 rad/h.

The ion-chamber current enters a current-to-frequency converter, which is the subject of Pat. Application, Ser. No. 522,744, and which was discussed earlier herein, the converter producing a pulse-repetition frequency proportional to this current over a 6-decade range due to large variations in radiation levels to be detected. A data processor then measures this frequency by counting the number of pulses from the converter over a selected integration interval to provide a digital representation of dose rate, and measures total dose by counting the number of pulses received since the dose measurement began. The data processor output controls a digital display, using for example light-emitting-diodes (LEDs), and an alarm system with both audible and visible outputs.

By controlling the interval between application of Reset commands to the current-to-frequency converter, the data processor reduces the required dynamic range of charge that the capacitive attenuator must handle from the $10^6$:1 range of input currents to a much smaller value. This reset feature permits the use of much smaller capacitors in the converter circuitry, thereby facilitating miniaturization.

Although several power systems are available, we have shown, for convenience, a rechargeable NiCd battery which supplies power to a dc-to-dc converter for generating operating voltages for all the apparatus electronics except the LED display and the switch logic, which operate directly from the battery. The switch logic determines when the dc-to-dc converter should be on and controls the operation of the display and alarms.

The circuitry is designed so that radiation overloads produce a distinctive signal to prevent potentially fatal confusion in environments with very high dose rates.

The present invention provides several features of novelty over the prior art, including the capability of the circuitry to provide multiple measurement functions such as dose rate and total integrated dose in a small, low-cost, portable apparatus.

It is an object of this invention to provide a digital-readout apparatus that accurately measures radiation levels over a very wide range.

It is another object of this invention to provide an apparatus having totally automatic range switching and having a detection-to-readout response time of two (2) seconds or less, said apparatus being adaptable to a multiplicity of radiation detectors including ionization chambers, $\beta$ counters, Geiger tubes, solid-state detectors, etc.

It is another object of this invention to provide a low-power drain apparatus having a small battery which is capable of operating the apparatus for several days and which is rechargeable from a low-voltage direct-current electrical system of an emergency or military-type vehicle and from standard alternating-current line power.

It is another object of this invention to provide an apparatus having an audible and/or visual alarm with a presetable alarm threshold.

It is a further object of this invention to provide an apparatus which is rugged and reliable and capable of easy operation, use, repair and maintenance by relatively unskilled people, to the extent that it can survive an air drop without damage, function properly in vehicles moving over very rough terrain, maintain its calibration for months, have a modular construction to facilitate rapid repair, and contain a minimum of adjustment to avoid misuse in the field.

It is a further object of this invention to provide an apparatus which can be produced for a low cost through emphasis on design simplicity, the incorporation of circuits which can be converted to LSI and hybrid-packaging techniques, and the use of digital techniques to produce predictable, reliable performance with high accuracies.

For a better understanding of this present invention, together with other and further objects thereof, reference is made to the following description taken in connection with the accompanying drawings in which preferred embodiments of the invention are illustrated, the scope of the invention being pointed out and contained in the appended claims.

DESCRIPTION OF THE PREFERRED EMBODIMENTS

Several terms which appear throughout this specification are defined here. The rad (r) is a measure of the amount of ionization produced in tissue by incident ionizing radiation. The measurement of radiation in units of rads is referred to as radiation dose rate or total dose measurements. Other measurements of the ionizing radiation include the Roentgen (R), which is the amount of ionization produced in air, and the rem, which attempts to define the damage done by ionizing radiation to a human being. Ionizing-radiation detectors that respond to rads, Roentgens or other measurement units are all encompassed within the scope of this invention.

Figure 1:
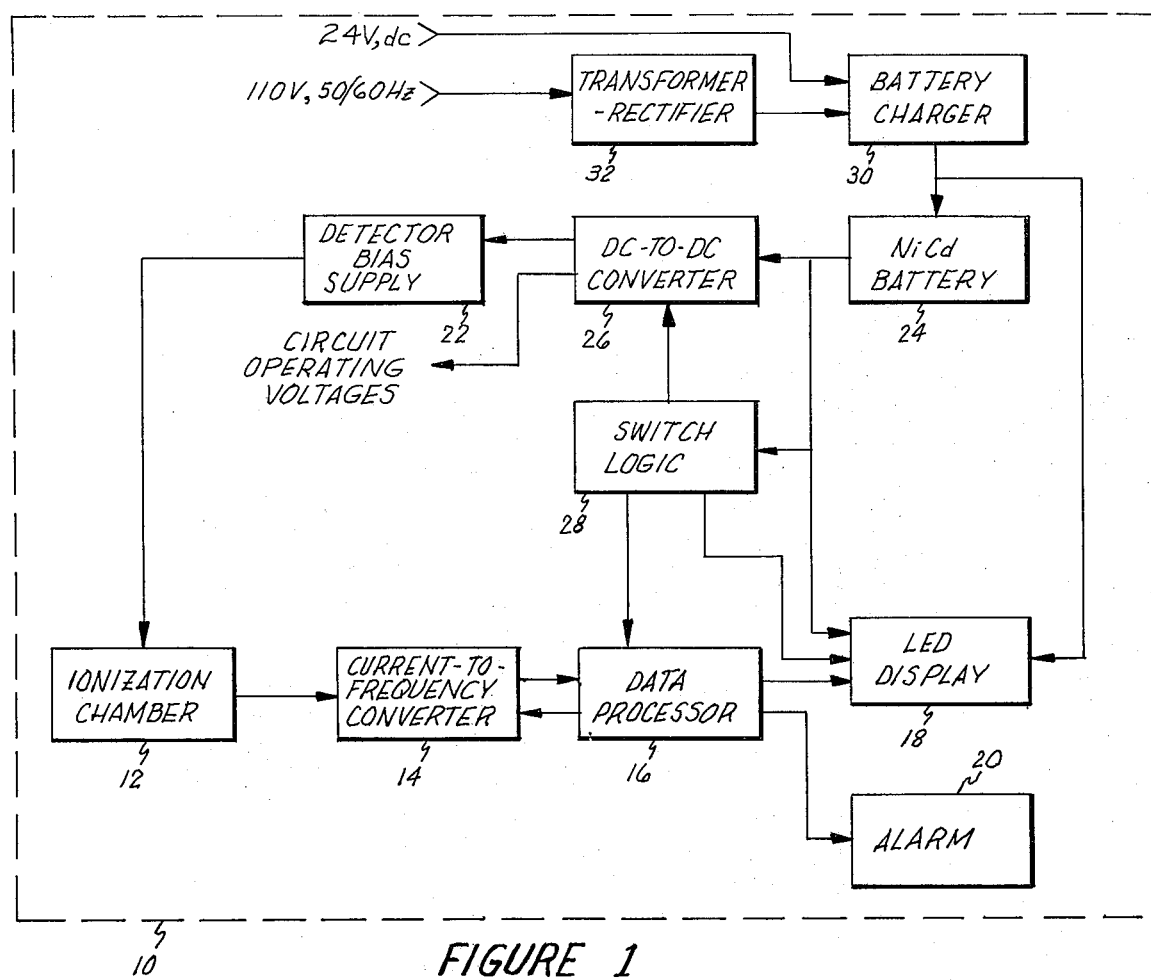
FIG. 1 is a block diagram of the preferred embodiment of this radiation detection system.

Turning to FIG. 1, there is shown in block diagram a radiation detection system 10 which makes use of pulse-repetition frequency to provide a digital indication of dose-rate and total dose. An ionization- (ion-) chamber radiation detector 12, which produces ions when exposed to radiation, is connected to the input of a capacitive-feedback current-to-frequency converter 14. The ion-chamber radiation detector 12 generates current in such a manner that it is proportional to dose-rate, and this current enters the converter 14, which produces a train of output pulses with a repetition frequency also proportional to dose-rate and to this current over as great as a 6-decade range. A data processor 16 provides dose-rate output by measuring this frequency by counting the number of pulses from the converter 14 over a selected integration integral. The data-processor 16 output controls a data readout display 18 and alarms 20 which may be of any convenient type or size having visible and/or audible outputs. For this embodiment, we have shown a 3-digit, floating point, light emitting diode (LED) for the display 18. Other data readout devices that may also be used as part of this invention include other visible display means such as incandescent lamps, liquid crystal displays or electromechanically actuated characters; data recording means such as printers, tape or card punches, magnetic recording devices, semiconductor or magnetic memories; data telemetering means such as radio, optical, acoustic or wired systems; and other readout means evident to those familiar with the art. A 250-V detector bias supply 22 insures the accurate collection of the ion-chamber detector 12 charge at dose rates up to 1000 rad/h.

Figure 3:
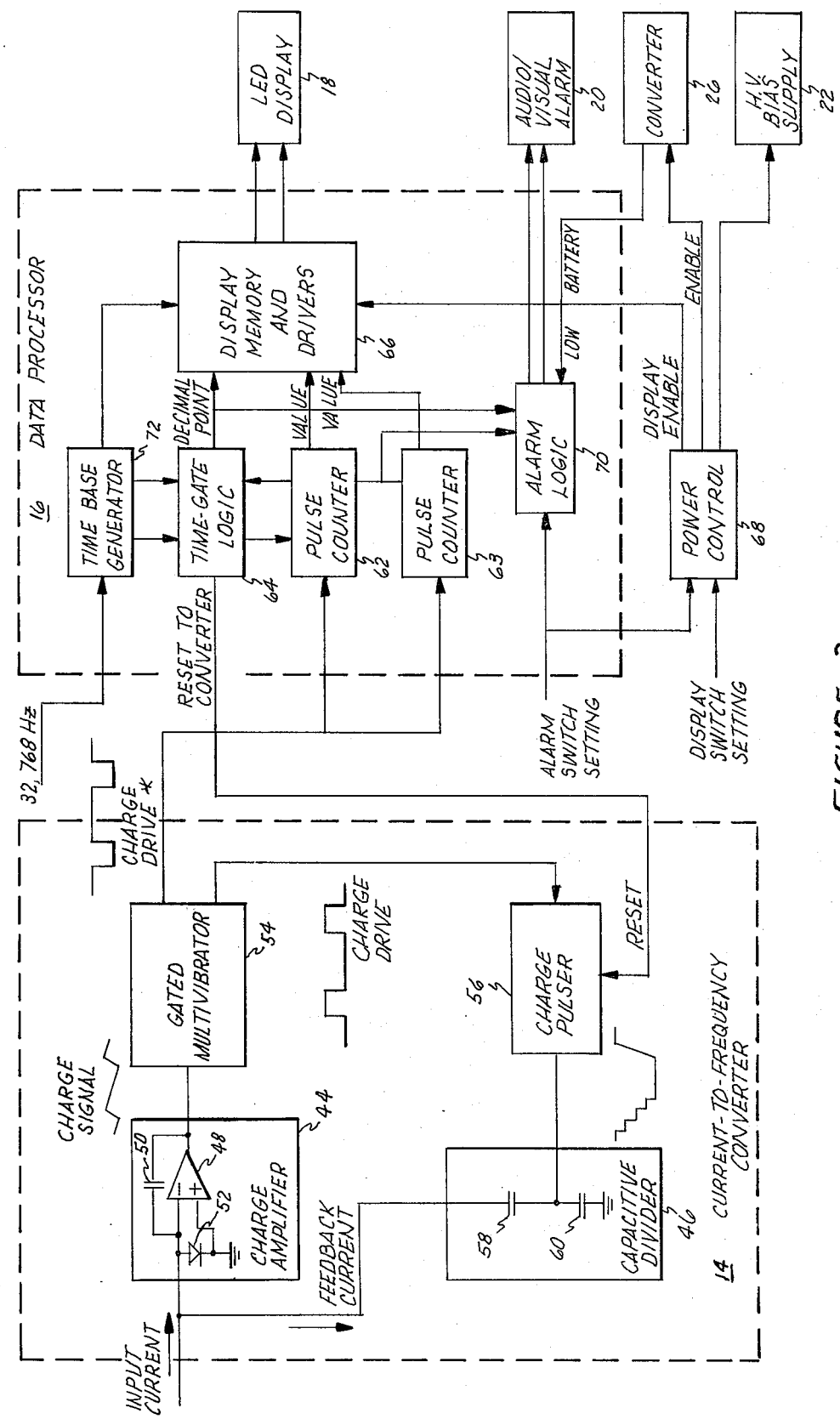
FIG. 3 is a block diagram of the current-to-frequency converter and the data processing, control and display logic contained in the system of FIG. 1.

Turning to FIG. 3, there is shown in block-diagram form an embodiment of the current-to-frequency converter 14. The converter 14 contains a charge amplifier 44, which produces the CHARGE SIGNAL at its output in response to the INPUT CURRENT and in response to the FEEDBACK CURRENT flowing through the capacitive divider 46 connected to the charge-amplifier 44 input.

In the embodiment shown in FIG. 3, the INPUT CURRENT flows toward the charge-amplifier input and the FEEDBACK CURRENT flows away from this input.

The INPUT CURRENT causes the CHARGE SIGNAL at the output of the amplifier 48 to move negatively until the gated multivibrator 54 triggers. At that time this circuit generates a positive pulse of fixed duration on the CHARGE-DRIVE line. The logical complement of the CHARGE-DRIVE signal appears as the CHARGE-DRIVE* signal and signifies to the data processor 16 that the gated multivibrator 54 triggered. The pulse repetition rate on the CHARGE-DRIVE line or on other lines logically related to the CHARGE-DRIVE line, such as the CHARGE-DRIVE* signal, contains the output frequency information from the current-to-frequency converter 14.

The CHARGE-DRIVE signal enters the charge pulser 56. Except when it is under control of the RESET signal to be described later, the charge pulser 56 produces a defined increment of charge whenever a positive transition occurs in the CHARGE-DRIVE signal. This charge flows out of the capacitive divider 46, which contains the junction of capacitor 58 with capacitor 60. The other end of capacitor 60 is connected to ground potential, whereas capacitor 58 is connected to the input of the charge amplifier 44. Because the negative feedback through capacitor 50 causes the impedance at the input of the charge amplifier 44 to appear momentarily low, the charge produced by the charge pulser 56 divides between capacitor 58 and capacitor 60 in the ratio of their capacitances. If the capacitance of capacitor 58 is much smaller than that of capacitor 60, then only a small fraction of the charge-pulser 56 output enters the charge-amplifier 44 input through capacitor 58. As a result the FEEDBACK CURRENT may be much smaller than the currents involved in the charge pulser 56, and thus leakage currents and other such error-producing effects associated with the charge pulser 56, which may contain semiconductors, are attenuated by an amount which may exceed 10,000:1. The capacitive divider 46, which in itself may have impedances for direct currents exceeding $10^{14}$ Ω and also very low leakage currents, has thus attenuated the deleterious leakage effects associated with semiconductors and other electronic components, which, if connected directly to the charge-amplifier 44 input, would prevent accurate operation for INPUT CURRENTS as small as $10^{-14}$ A.

In response to that portion of the charge-pulser 56 output signal coupled through capacitor 58 to the input of the charge amplifier 44, the CHARGE SIGNAL at the output of amplifier 48 rises rapidly. After a time interval equal to approximately twice the width of the positive pulse on the CHARGE-DRIVE line, the gated multivibrator 54 interrogates the CHARGE SIGNAL. If this signal has not risen sufficiently to exceed the threshold of the gated multivibrator 54, it proceeds to generate a second CHARGE-DRIVE pulse. This sequence continues until the output voltage of amplifier 48 rises above the threshold level.

Thus, the output of amplifier 48 oscillates about the threshold voltage of the gated multivibrator 54 such that the charge removed from the input of amplifier 48 through capacitor 58 equals the charge supplied at the amplifier 44 input. Whenever each positive transition of the CHARGE-DRIVE signal causes a fixed charge to be withdrawn from the amplifier 48 input, the repetition rate of CHARGE-DRIVE signals is proportional to the INPUT CURRENT.

It is well known to those skilled in the art that, if the feedback charge were varied in a known way dependent on input signal, then the dynamic range of the converter 14 could be further increased. For example, the data processor 16 could command a change in the capacitive division ratio of the capacitive divider 46, or the charge pulser 56 could provide a varying charge output. Furthermore, the combination of the gated multivibrator 54 with the charge pulser 56 is just one possible mechanization of a charge-generating device, which produces known, discrete charge impulses under the control of the charge amplifier 44 and the data processor 16, and which signifies to the data processor 16 whenever it has produced such a charge impulse. Such a charge-generating device could produce bipolar as well as uni-polar charge pulses and could signify to the data processor 16 which polarity it was producing, in order to permit the quantization of bipolar input currents.

The action of the overall feedback loop of the converter 14 causes the voltage across capacitor 60 to fall negatively. In order to avoid excessive voltages across capacitor 60 and the saturation of the charge pulser 56, the data processor 16 must occasionally interrupt the quantizing process in order to discharge the capacitors in the capacitive divider 46. At such times, the RESET signal commands the charge pulser 56 to return its output to near ground potential, forcing a positive current through capacitor 58 into the charge amplifier 44. This relatively large current places the clamp diode 52 in conduction, which provides a dc path for the recharging of capacitor 58. After the current pulse in capacitor 58 dies away, diode 52 stops conducting after drawing the input of amplifier 48 back toward its quiescent value.

Because the impedance of diode 52 becomes very high before the quiescent value is finally reached, this decay is only asymptotic and often must be speeded up by a feedback mechanism. This speed up may be allowed to occur automatically in that the CHARGE SIGNAL at the output of amplifier 48 is below the threshold of the gated multivibrator 54 during the reset sequence, causing CHARGE-DRIVE pulses to be generated continuously at their maximum rate. These pulses will continue until the output of amplifier 48 returns to its quiescent value just above the threshold of the gated multivibrator 54. During this reset period, the data processor 16 should ignore the output of the current-to-frequency converter 14. Such a reset sequence should precede each integration interval.

The time required for this reset sequency, which is a time during which the current-to-frequency converter 14 is not processing an input signal, equals the sum of the time required for the charge pulser 56 to discharge the capacitive divider 46 and the time for the current produced by the gate multivibrator 54 and the charge pulser 56 operating at their maximum frequency to return the CHARGE SIGNAL at the output of the amplifier 48 to its quiescent level. This latter time under some circumstances can lead to an excessive converter "dead time," and thus a secondary feedback mechanism, not shown, is sometimes desirable for restoring normal converter operation more rapidly. Once such technique involves connecting the cathode of diode 52 to the output of amplifier 48 while the capacitive divider 46 is being discharged instead of to ground potential. During the normal conversion process the cathode of diode 52 is returned to ground potential. This modification of the basic reset sequence permits the output of amplifier 48 to restore rapidly its own input to near its quiescent value, substantially reducing the number of CHARGE-DRIVE pulses necessary to perform this function and thus eliminating one of the major sources of converter dead time.

Both of these reset sequences have the property that the current-to-frequency converter 14 repeatedly establishes its own zero level at a rate given by the rate of occurrence of RESET pulses. As a result, the converter 14 automatically nulls out the effects of varying offset voltages at its input at frequent intervals, allowing it to provide accurate operation over a dynamic range of $10^7:1$. If the operational amplifier 48 has a balanced input stage, then this nulling process forces the input to rest near ground potential, thus reducing leakage currents through diode 52, capacitor 58 and any other components connected to the input. Thus, the use of capacitive divider 46 to introduce the FEEDBACK CURRENT, together with a reset sequence which automatically compensates for varying amplifier offset voltages and forces the converter 14 input to remain near ground potential, permits accurate operation over a wide range of INPUT CURRENTS, which may be as small as $10^{-14}$ A, without external zeroing circuits or electrometer amplifiers.

Returning to FIG. 1, we have shown a rechargeable NiCd battery 24, although various battery types or line power may be used, that would supply power to the dc-to-dc converter 26, which generates closely regulated operating voltages for all the system 10 electronics except the display 18 and the switch logic 28, which operate directly from the battery 24. The switch logic 28, which uses CMOS integrated circuits whose standby power is infinitesimal, determines when the dc-to-dc converter 26 should be on and controls the operation of the display 18 and the alarms 20. The battery 24 is continuously charged by battery charger 30 whenever a source of 24 Vdc is connected to the charger 30 or whenever a 110-v, 50/60-Hz, source is connected to a transformer-rectifier 32 for operating the charger 30 to which it is also connected The detector bias supply 22 is a miniaturized high-voltage supply for operation of the ion-chamber detector 12. This supply 22 contains a well-shielded 1-MHz tuned oscillator operating class C with a one-turn coil looped through a toroidal transformer to provide positive feedback necessary to sustain the oscillations and a capacitive multiplier with negative feedback to stabilize the output voltage.

The dc-to-dc converter 26 is a low-voltage power system which contains a duty-cycle-modulated, crystal-controlled oscillator to pulse a shielded auto-transformer to provide the required closely-regulated output voltages. The primary advantage of duty-cycle modulation is that the input is nearly independent of input voltage over a wide range. The dc-to-dc converter 26 is a small-size, stable high-frequency system. It further serves to provide a 32.768-kHz reference frequency for the time base for the total system.

The current produced by a 15-cm$^3$ ion-chamber detector 12 filled with argon at a pressure near ten atmospheres is $2 \times 10^{-14}$A at 1 mrad/h. At the full-scale dose rate of 999 rad/h, this current rises to $2 \times 10^{-8}$ A, showing that the output frequency must vary over a 6-decade range. If the display 18 contains three digits and a moving decimal point so that it can indicate dose rates from 0.001 rad/h to 999 rad/h, then the maximum digitizing resolution becomes 1 mrad/h. If a 2-s response time determines the maximum integration interval, then the digitizing resolution referred to ion-chamber detector 12 charge becomes 0.04 pC/pulse and the full-scale frequency is 0.5 MHz. This low value for full-scale output frequency allows the use of low-power digital circuits.

At 999 rad/h the converter 14 would produce in 2 s $10^6$ pulses, which represent a total charge of 40 nC. Although a $10^6:1$ dynamic range exists in current and frequency, it need not exist in charge. In order to reduce this dynamic range, the data processor 16 will automatically vary the reset period by shortening the measurement interval at dose rates above 0.1 rad/h in such a manner that the maximum number of pulses produced during any measurement interval is 1000, yielding a full-scale ion-chamber 12 charge of 40 pC and a 2-ms measurement interval at 999 rad/h. If the dose rate exceeds 999 rad/h, the output frequency rises above 0.5 MHz and the data processor signals to the display that an overload condition exists.

Protection against unexpected voltage breakdowns or arcs in the ion chamber detector 12 or its bias supply 32 is provided so as not to damage the converter 14. The converter 14 is also immune to paralysis from reversed-polarity input currents. Noise and offset currents do not add greatly to the 1 mrad/h digitizing resolution of this system. In order to achieve an operating life in excess of a few days using small batteries, this circuit does not consume more than 4 mW for low radiation levels.

Returning to FIG. 3 there is also shown a functional block diagram of the data-processing, control and display logic. The dose rate is measured by the pulse counter 62 under control of the time-gate logic 64. The value of dose rate controls the 3-digit display 18 through the display drivers 66, while the range is displayed through the time-gate-logic 64 control of the decimal point. The time-gate logic 64 selects an integration interval for the pulse counter 62 from one of four intervals - 2 ms, 20 ms, 200 ms and 2 s - based upon the number in the dose-rate counter 62 at the end of each interval. If the number exceeds 100, then counting stops and the decimal point is properly located. For dose rates below 100 mrad/h, a maximum integration time of 2 s is used. For example, a dose rate of 20 rad/h, which produces a CHARGE DRIVE frequency of 10,000 pulses/s, would have the counter 62 stop after 20 ms, because at that time 200 counts would have accumulated. The display 18 would be 20.0, 200 from the accumulated counts and XX.X from the fact that the accumulation stopped at 20 ms. One dose-rate measurement is made each 2 s. There is also shown a second counter 63 that counts all pulses and is not reset except by a total-dose reset command.

The operation of the system can be influenced by utilizing switches 36 and 40, FIG. 2, as fully described hereinafter. Continuing on, with regard to FIG. 3, the power control logic 68 required to implement these functions is a simple array of CMOS logic, operating directly from the battery 24 voltage. This logic 68 enables data display 18 when the display switch 40 and battery 24 charging operation permit, turns on the instrument power converter 26 when required, and operates the ion-chamber bias supply 22.

Operation of the audio and visual alarms 20 may be made to depend upon radiation levels and switch 36 and 40 settings for radiation alarms, and upon the low-battery signal for the distinct battery-condition alarm. The six alarm levels correspond to decade steps between 10 mrad/h and 1000 rad/h and are selected by switch 36. They are detected by examining the pulse counter 62 and the time-gate logic 64 to establish the value and decimal-point position, respectively. If the incoming dose rate exceeds the value set on the alarm switch 36, then a latch in alarm logic 70 sets, and the alarm 20 is enabled. The alarm 20 then may be sounded for one of three selected intervals every 2 seconds; for example, for 0.2 s if the incident dose rate is below 100 mrad/h, 1.8 s if the rate is between 100 mrad/h and 10 rad/h, and continuously if the rate exceeds 10 rad/h. The latch in alarm logic 70 will reset if the display switch 40 is placed in the ON-INT position or if the alarm switch 36 is turned to off.

The converter-reset signal is present at all times the converter 14 is on except when charge-drive counts are actually allowed to enter the pulse counter 62 and counter 63 for total dose.

The display memory and driver circuits 66 store the dose-rate count and decimal point values and drive the LED display 18. Display 44 is operated in the multiplex mode for optimum visibility and minimum hardware.

The time-base generator 72 provides the various clocks and timing gates to operate the logic in data-processor 16. These signals range in frequency from the 8.192-kHz clock that runs the multiplexed display circuits 44 to the 10-s interval that actuates the low-battery alarm 20. All of these signals are digitally derived from 32,768 Hz.

Figure 2:
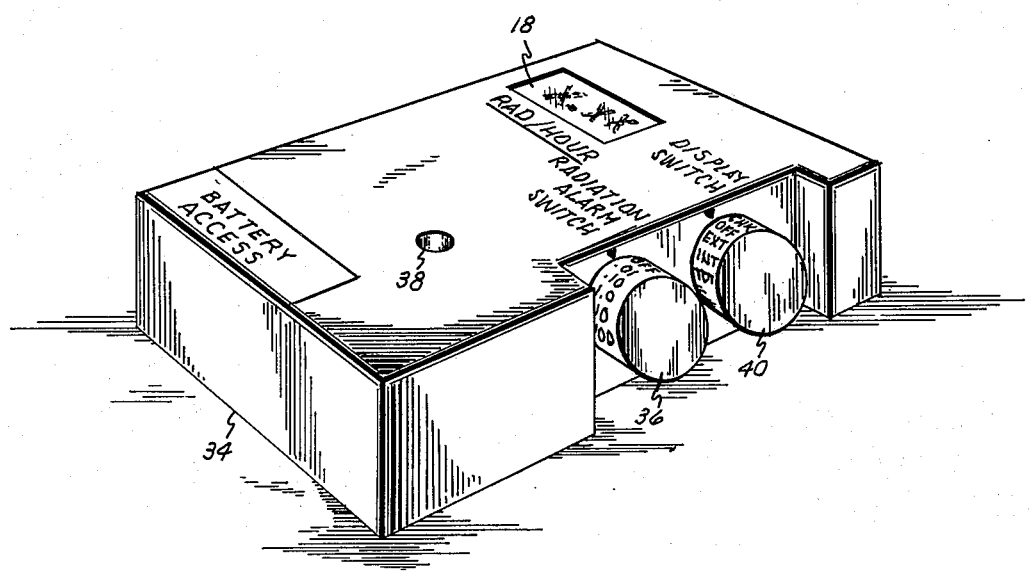
FIG. 2 is a perspective view of a radiation detector apparatus embodying the features of the present invention.

In FIG. 2, there is presented a perspective view of a radiation detection instrument 34 which, in this embodiment, shows provision for no external adjustments and only two operator controls, one of these two controls being the radiation alarm switch 36 which determines the dose-rate threshold for generating audible and visible alarm signals. Six-decade-related thresholds from 0.01 rad/h to 1000 rad/h are provided for, although further provision for finer resolution or different steps can readily be provided. When the alarm switch 36 is in any position except OFF, it causes the dc-to-dc converter 26 to apply power to the instrument 34 but does not turn on the display 18. As a result, the instrument 34 will be continuously monitoring the radiation field with a sufficiently low power drain from the battery 24 to enable several days of operation at 20°C in this mode before the necessity of recharging.

If the alarm threshold is even momentarily exceeded, the instrument enters the alarm mode producing both audible and visual signals. From a selection of numerous types of audible alarms, there is shown for convenience a pipe 38 resonant at about 2 kHz for producing the audible output, whereas a single LED display 18 generates a visible signal whenever the pipe 38 produces a sound burst. The sound burst and light flashes can be coded in any of a number of ways to provide a rough indication of the instantaneous dose rate. One example may include the following coding. For dose rates between 0.001 rad/h and 0.09 rad/h, the alarm signal would last for 0.2 s out of each 2-s measurement interval; for dose rates between 0.1 rad/h and 9.99 rad/h, the alarm signal would occur during 1.8 s of each 2-s interval; for dose rates above 10 rad/h, the alarm signal would be present continuously. If the dose rate falls below the alarm threshold, the alarm mode may be made to terminate by momentarily turning on the display switch 40.

The battery 24, when discharged, will also initiate the alarm mode whenever the dc-to-dc converter 26 is on. A 1-s sound burst and light flash followed by a 1-s quiet and dark period once each 10 s distinguishes this type of alarm from a dose-rate alarm which may be present simultaneously.

The other instrument control is the display switch 40 which in this embodiment is shown to have five positions. In the OFF position, the display 18 will be dark, and the dc-to-dc converter 26 will not operate whenever the alarm switch 36 is also in its OFF position. In the ON-EXT position, shown as EXT on the display switch 40, the dc-to-dc converter 26 and the display 18 will operate continuously only if external power is present. Otherwise, this position and the OFF position would be identical. The switch 40 would remain stationary without constant pressure in only these two positions.

The ON-INT position, shown as INT on switch 40, would be spring loaded, and switch 40 could be rotated to the instrument 34 in this mode. As long as the switch 40 was held, the dc-to-dc converter 26, and the display 18 could operate continuously. This mode is intended for use when external power is not available, and the spring-loaded feature of the switch 40 could prevent the battery 24 from being inadvertently discharged by continual operation of the display 18. If external power is available, it could supply the display 18 in either the ON-EXT or ON-INT mode, permitting the instrument to be used while the battery 24 is being charged. A dose-rate reading would appear 2 ; s after the instrument is placed in either the ON-INT or ON-EXT modes.

In the CIRCUIT-CHECK position, shown as CHK on the switch 40, the instrument would operate in the same manner as in the ON-INT mode except that a signal corresponding to 500 rad/h would be added to the current-to-frequency converter 14. This mode would exercise many of the subsystems in instrument 34 to provide a quick indication of serious faults. True calibration, however, should be performed with a radioactive source or X-ray machine to include the ion chamber 12 and its bias supply 22. The CIRCUIT-CHECK position of the DISPLAY switch 40 would also be spring loaded to prevent erroneous readings and inadvertent discharge of the battery.

In its fifth position, TOTAL DOSE, shown as TOT on switch 40, the operator will obtain a total-dose reading which will provide a cumulative reading for each period that the instrument is in operation. The reading will be zeroed out whenever the instrument is turned off; otherwise the total dose is continuously being accumulated even while operating the instrument in other modes.

What is claimed as new is:

1. For use in combination with a radiation detector producing a current output signal corresponding to the amount of radiation incident on the detector, an improved digitizing circuits for providing a digital representation of radiation level over a wide range, the improved circuit comprising:
   a. current-to-frequency converter means operably associated with the radiation detector for producing a pulse-repetition frequency representative of the output current of the detector; and
   b. data-processing means operably associated with the current-to-frequency converter means for measuring the pulse-repetition frequency, and to provide a digital representation of radiation level by counting pulses over a selected time interval.

2. The circuit of claim 1, above, wherein the current-to-frequency converter means is a capacitive-feedback current-to-frequency converter requiring periodic discharge, the converter comprising:
   a. amplifier means receiving an input current for providing a comparison between the input current and a discrete feedback charge applied to the amplifier means, and for producing an output voltage proportional to the difference between the charge produced by the input current and the feedback charge;
   b. charge-generating means connected to the output of the amplifier means for producing known amounts of charge of possibly either polarity whenever the amplifier means indicates that the sum of the charges fedback has a smaller absolute magnitude than the input charge, and for producing an output frequency signal; and
   c. capacitive-divider means connected between the charge-generating means and the amplifier means for the attenuation of the output of the charge-generating means.

3. The circuit of claim 1, above, wherein the data-processing means comprises:
   a. first pulse counting means operably associated with the converter means for measuring the pulse-repetition frequency representative of the detector output current by counting pulses over a selected time interval; and
   b. time-gate logic means operably associated with the converter means and the first pulse counting means for selecting an integration interval for operation of the first pulse counting means and for varying the reset period of the converter means to reduce its dynamic range in charge.

4. The circuit of claim 3, above, further comprising a second pulse-counting means operably associated with the converter means for measuring the total charge produced within the detector to provide an indication of total dose to which the detector is exposed during a time interval which may be different from that used in the first pulse counting means.

5. The circuit of claim 3, above, further comprising data readout means for providing a digital signal representative of the output of the data-processing means and for simultaneously storing the signal while a new measurement is being accumulated.

6. The circuit of claim 5, above, wherein the data readout means comprises:
   a. display memory and driver logic means operably associated with the first and second pulse counting means, and the time-gate logic-means for storing the output of the data-processing means while a new output measurement from the data-processing means is being accumulated; and
   b. a display read-out device for providing a visible digital representation of radiation level.

7. The circuit of claim 3, above, further comprising alarm signaling means operably associated with the time-gate logic means and the first pulse counting means for signaling when a predetermined radiation level has been reached.

8. The circuit of claim 1, above, further comprising power supply means including:
   a. a detector bias supply operably associated with the radiation detector to provide for the accurate collection of the ionizing-radiation detector charge at maximum dose rates;
   b. dc-to-dc converter means for providing regulated operating voltages to the circuit; and
   c. a battery operably associated with the dc-to-dc converter means for providing the principal power source for the circuit.

9. For use in combination with a radiation detector which produces a current output signal corresponding to the level of radiation incident on the detector, an improved digitizing circuit for providing a digital representation of radiation level over a wide range, the improved circuit comprising:
   a. a capacitive-feedback current-to-frequency converter operably associated with the radiation detector for producing a pulse repetition frequency representative of the output current of the ionizing-radiation detector;
   b. first pulse counting means operably associated with the current-to-frequency converter for measuring the pulse-repetition frequency by counting the number of pulses over a known time interval;
   c. time-gate logic means operably associated with the current-to-frequency converter and the first pulse counting means for selecting an integration interval for operation of the pulse counter and for varying the reset period of the converter to reduce its dynamic range in charge;

d. display means for providing a digital signal representative of radiation level; and
e. power supply means for providing proper operating voltages to the circuit and to the ionization chamber.

10. The circuit of claim 9, above, wherein the display means comprises:
   a. display memory and driver logic operably associated with the pulse counting means and time-gate logic means for storing the pulse count value and its decimal point; and
   b. a display device operably associated with the display memory and driver logic for providing a digital readout of radiation level detected.

11. The circuit of claim 9, above, further comprising a second pulse-counting means operably associated with the converter means for measuring the total charge produced within the detector to provide an indication of total dose to which the detector is exposed during a time interval which may be different from that used in the first pulse counting means.

12. The circuit of claim 9, above, wherein the power supply means comprises:
   a. a detector bias supply operably associated with the radiation detector for facilitating the accurate collection of the detector charge at maximum dose rates;
   b. dc-to-dc converter means for providing regulated operating voltages to the circuit; and
   c. a battery operably associated with the dc-to-dc converter means for providing the principal power source for the circuit.

* * * * *